(12) United States Patent
Watanabe et al.

(10) Patent No.: US 6,461,942 B2
(45) Date of Patent: Oct. 8, 2002

(54) SEMICONDUCTOR CHIP REMOVING AND CONVEYING METHOD AND DEVICE

(75) Inventors: Mitsuhisa Watanabe, Kawasaki (JP); Kazuo Teshirogi, Kawasaki (JP); Eiji Yoshida, Kawasaki (JP); Yuzo Shimobeppu, Kawasaki (JP); Yoshito Konno, Kawasaki (JP); Kyouhei Tamaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/746,066

(22) Filed: Dec. 26, 2000

(65) Prior Publication Data

US 2001/0049160 A1 Dec. 6, 2001

(30) Foreign Application Priority Data

May 31, 2000 (JP) .......................... 2000-163651

(51) Int. Cl.[7] .................. H01L 21/44; H01L 21/48; H01L 21/50; H01L 21/46; H01L 21/78; H01L 21/301

(52) U.S. Cl. .......................................... 438/464; 438/114
(58) Field of Search .................................. 438/464, 114

(56) References Cited

U.S. PATENT DOCUMENTS 6,297,075 B1 * 3/2000 Odajima et al. ............ 438/110
6,136,137 A * 10/2000 Farnworth et al. .......... 156/344

FOREIGN PATENT DOCUMENTS

JP   11-45934   2/1999

* cited by examiner

*Primary Examiner*—Tuan H. Nguyen
*Assistant Examiner*—Nema Berezny
(74) *Attorney, Agent, or Firm*—Armstrong, Westerman & Hattori, LLP

(57) ABSTRACT

Semiconductor chips are formed on a wafer. The wafer is diced, while a dicing tape applied to the wafer is kept intact. Each of the semiconductor chips is fixed by suction and then removed from the dicing tape. Each of the semiconductor chips is unfixed by ceasing the suction and picked up and conveyed.

3 Claims, 13 Drawing Sheets

SEMICONDUCTOR CHIP REMOVING AND CONVEYING METHOD AND DEVICE

BACKGROUND OF THE INVENTION

1. Field of the Invention

The present invention generally relates to a method and a device for removing and conveying semiconductor chips and, more particularly, to a method and a device for removing and conveying semiconductor chips by removing a dicing tape from the semiconductor chips formed and diced on a wafer and conveying the semiconductor chips stripped of the dicing tape.

2. Description of the Related Art

Conventionally, a dicing tape is applied to a plurality of semiconductor chips formed on a wafer. Dicing then divides the semiconductor chips into separate semiconductor chips. The dicing tape is removed from the separate semiconductor chips. The separate semiconductor chips are then conveyed to predetermined locations, being held by such a method as a vacuum pick-up method.

As a dicing tape, an adhesive ultravioletcure pressure-sensitive tape (referred to as UV tape) is generally used. The UV tape is cured by ultraviolet ray projection after dicing. This reduces the adhesion force of the UV tape to the semiconductor chips and facilitates the removal of the semiconductor chips from the UV tape.

Generally, semiconductor chips are removed from a dicing tape by a needle push-up method, wherein pressing a needle against the semiconductor chips from the backside of the dicing tape and pushing up the semiconductor chips removes the semiconductor chips from the dicing tape. The needle has a pointed end and breaks through the dicing tape to reach and push up the semiconductor chips. The semiconductor chips removed from the dicing tape are held by collets.

Recently, the size of semiconductor chips has been increased, while the thickness thereof has been decreased. These semiconductor chips are likely to be damaged by the above-mentioned needle push-up method. That is, because the needle concentrates stress on a point where it contacts, pushing up by the needle may break or chip the semiconductor chips. In some cases, the sharp pointed end of the needle may leave a scratch on the semiconductor chips, which scratch may later cause the semiconductor chips to break.

SUMMARY OF THE INVENTION

It is a general object of the present invention to provide an improved and useful method for removing and conveying semiconductor chips in which method the above-mentioned problems are eliminated.

A more specific object of the present invention is to provide a method and a device for removing and conveying semiconductor chips which method and device can remove the semiconductor chips from a dicing tape by a removing method and immediately pick up and convey the semiconductor chips.

In order to achieve the above-mentioned objects, there is provided according to one aspect of the present invention a method of removing and conveying semiconductor chips, the method comprising the steps of:

dicing a wafer while keeping intact a dicing tape applied to the wafer, the wafer having a plurality of semiconductor chips formed thereon;

fixing by suction a surface of each of the semiconductor chips, the surface being opposite to another surface to which the dicing tape is applied;

removing the dicing tape from the semiconductor chips; and picking up and conveying the semiconductor chips while unfixing the semiconductor chips by ceasing suction.

According to the present invention, the dicing tape is removed from the semiconductor chips while the surface opposite to where the dicing tape is applied is fixed by suction. In the removing step herein, the needle push-up method is not used so as to prevent the needle from damaging the semiconductor chips. Also, in this manner, the dicing tape can be removed easily from thin-type semiconductor chips to which the needle push-up method is not applicable. Additionally, the semiconductor chips removed from the dicing tape can be immediately picked up by such a method as vacuum pick-up, then continually followed by the conveying step. Accordingly, the steps from dicing through removing the dicing tape to conveying can be performed continuously to simplify the semiconductor chip manufacturing steps.

Additionally, in the present invention, the step of picking up and conveying the semiconductor chips is performed after removing the dicing tape from all of the semiconductor chips.

According to the present invention, the semiconductor chips are picked up and conveyed after the removal of the dicing tape from all of the semiconductor chips. Here, the step of picking up and conveying is required to be performed only once, thus simplifying the step.

Additionally, in the present invention, the step of removing and the step of picking up and conveying are repeated for each row of the semiconductor chips, in a manner of removing the dicing tape from one row of the semiconductor chips, picking up and conveying the one row of the semiconductor chips and then removing the dicing tape from the next row of the semiconductor chips.

According to the present invention, the dicing tape is removed from one row at a time, and the one row is then picked up and conveyed. Therefore, the rest of the semiconductor chips yet to undergo the steps of removing, picking up and conveying remain attached to and protected by the dicing tape.

Additionally, in the present invention, the dicing tape is divided into strips along rows of the semiconductor chips in dicing the wafer; and the step of removing and the step of picking up and conveying are performed individually for each of the semiconductor chips, in a manner of removing the dicing tape from one chip in one row of the semiconductor chips, immediately picking up and conveying the one semiconductor chip and then removing the dicing tape from another semiconductor chip.

According to the present invention, each of the semiconductor chips is individually removed from the dicing tape and conveyed. Therefore, the semiconductor chips remain attached to and protected by the dicing tape until the removing step.

Additionally, in order to achieve the above-mentioned objects, there is also provided according to another aspect of the present invention a method of removing and conveying semiconductor chips, the method comprising the steps of:

dicing a wafer while keeping intact a dicing tape applied to the wafer, the wafer having a plurality of semiconductor chips formed thereon;

placing the semiconductor chips on a removing stage with the side to which the dicing tape is applied facing downward;

removing the dicing tape from the semiconductor chips by bending a margin of the dicing tape downward around an edge of the removing stage and moving the removing stage while pulling the margin of the dicing tape downward;

transferring the semiconductor chips removed from the dicing tape to a chip receptacle by arranging the chip receptacle close to the edge of the removing stage and moving the chip receptacle together with the removing stage; and picking up and conveying the semiconductor chips transferred to the chip receptacle.

According to the present invention, since the semiconductor chips do not need to be fixed during the step of removing the dicing tape, a removing mechanism can be simplified. Additionally, in the removing step herein, the needle push-up method is not used so as to prevent the needle from damaging the semiconductor chips. Also, in this manner, the dicing tape can be removed easily from thin-type semiconductor chips to which the needle push-up method is not applicable. Additionally, the semiconductor chips removed from the dicing tape can be immediately picked up by such a method as vacuum pick-up, then continually followed by the conveying step. Accordingly, the steps from dicing through removing the dicing tape to conveying can be performed continuously to simplify the semiconductor chip manufacturing steps.

Additionally, in order to achieve the above-mentioned objects, there is provided according to still another aspect of the present invention a device for removing a dicing tape from a wafer and conveying a plurality of semiconductor chips formed on the wafer, the wafer being diced with the dicing tape kept intact, the device comprising:

a vacuum chuck unit which fixes by suction a surface of the semiconductor chips, the surface being opposite to another surface to which the dicing tape is applied;

a removing mechanism which removes the dicing tape from the semiconductor chips;

a first shutter provided on a fixing part of the vacuum chuck unit and movable in predetermined directions, which first shutter closes openings which, before the semiconductor chips are conveyed, fixes the semiconductor chips by suction;

a second shutter provided on the fixing part of the vacuum chuck unit and movable in directions perpendicular to the directions in which the first shutter is movable, which second shutter closes openings for fixing so as to unfix the semiconductor chips by ceasing suction; and a pick up head which picks up and conveys the semiconductor chips unfixed by ceasing suction.

According to the present invention, the second shutter can individually unfix by ceasing suction the semiconductor chips removed from the dicing tape and targeted to be picked up. Thereby, the rest of the semiconductor chips yet to be picked up and conveyed can remain fixed by continued suction. Additionally, the first shutter closes the openings for fixing which, before the semiconductor chips were picked up and conveyed, had been fixing the semiconductor chips by suction. Thus, the rest of the semiconductor chips yet to be picked up and conveyed remain properly fixed, unaffected by the otherwise continued suction of the openings.

Additionally, in order to achieve the above-mentioned objects, there is further provided according to another aspect of the present invention a device for removing a dicing tape from a wafer and conveying a plurality of semiconductor chips formed on the wafer, the wafer being diced with the dicing tape kept intact, the device comprising:

a mobile chuck capable of moving in predetermined directions, which mobile chuck individually fixes by suction each chip in one row of the semiconductor chips from a surface opposite to another surface to which the dicing tape is applied and which mobile chuck is capable of unfixing any of the semiconductor chips by ceasing suction;

a removing mechanism which removes the dicing tape from the semiconductor chips fixed by suction by the mobile chuck; and a pick up head which picks up and conveys the semiconductor chips unfixed by ceasing suction.

According to the present invention, the dicing tape can be removed from one row at a time, and the one row can then be picked up and conveyed. Therefore, the rest of the semiconductor chips yet to undergo the steps of removing, picking up and conveying remain attached to and protected by the dicing tape. Additionally, the mobile chuck individually fixes by suction another row of the semiconductor chips after one row is removed from the dicing tape. Herein, the mobile chuck can individually unfix each of the semiconductor chips. Accordingly, all or any number of the semiconductor chips in one row can be picked up at a time.

Other objects, features and advantages of the present invention will become more apparent from the following detailed description when read in conjunction with the accompanying drawings.

DETAILED DESCRIPTION OF THE PREFERRED EMBODIMENTS

A description will now be given, with reference to the drawings, of an embodiment according to the present invention.

Figure 1:
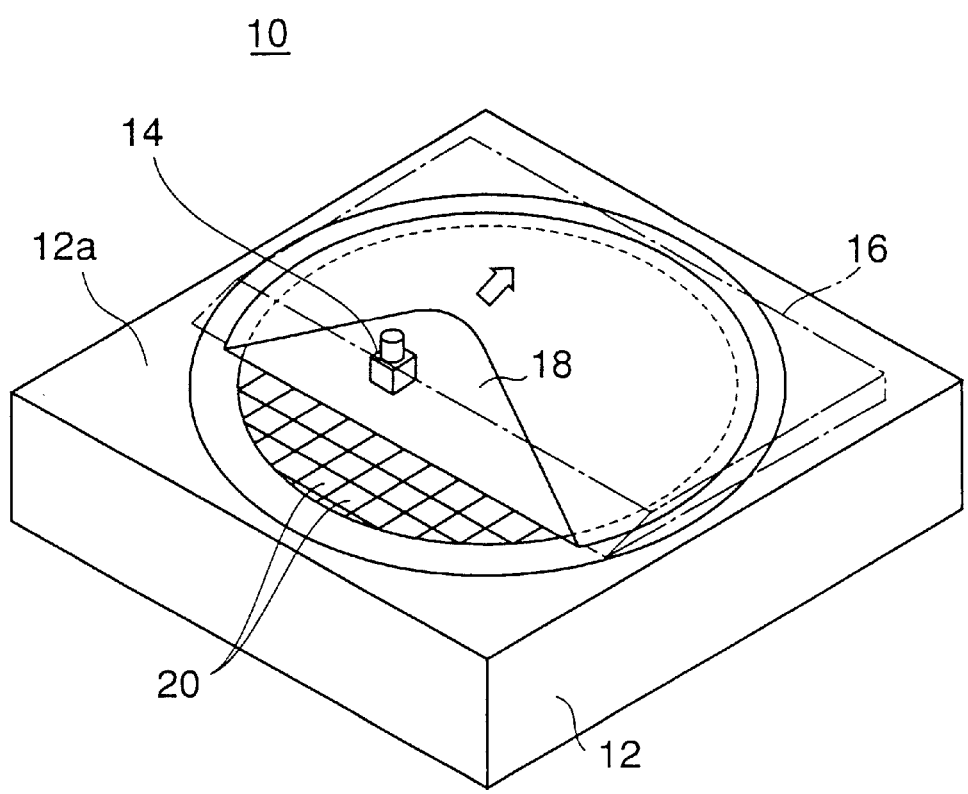
FIG. 1 is a perspective view of a device for removing and conveying semiconductor chips according to a first embodiment of the present invention.
Figure 2:
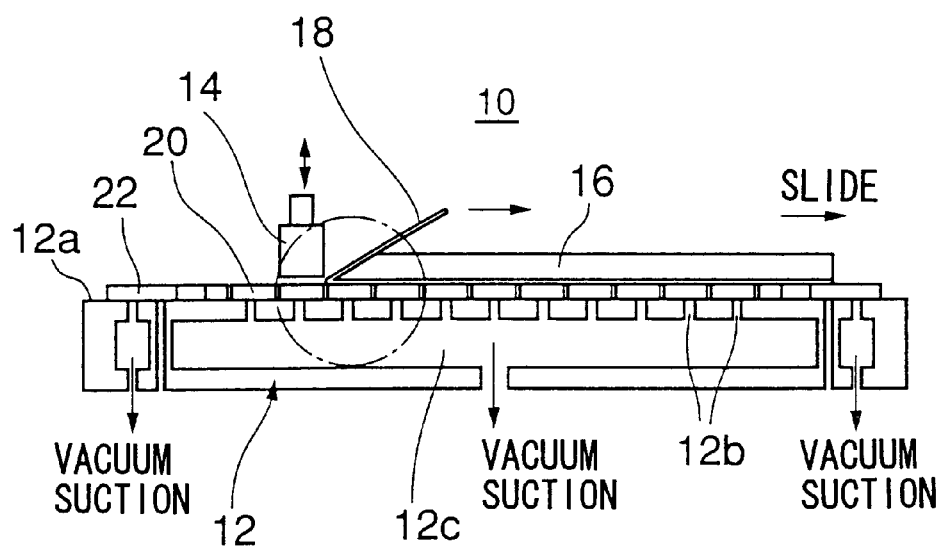
FIG. 2 is a cross-sectional view of the device for removing and conveying semiconductor chips according to the first embodiment of the present invention.

FIG. 1 is a perspective view of a device for removing and conveying semiconductor chips according to a first embodiment of the present invention. FIG. 2 is a cross-sectional view of the device for removing and conveying semiconductor chips according to the first embodiment of the present invention.

A semiconductor chip removing and conveying device 10 (referred to as device 10 hereafter) according to the first embodiment of the present invention comprises a vacuum chuck unit 12, a pick up head 14 and a removing board 16.

A plurality of semiconductor chips 20 applied to a dicing tape 18 are placed on the upper surface 12a of the vacuum chuck unit 12. The upper surface 12a is provided with suction openings 12b located correspondingly to each of the semiconductor chips 20. The suction openings 12b fix each of the semiconductor chips to the upper surface 12a by suction. As shown in FIG. 2, in the interior of the vacuum chuck unit 12 is a suction component 12c in communication with the suction openings 12b. The suction component 12c is connected to a suction pump (not shown in the FIG.).

The semiconductor chips 20 placed and fixed on the upper surface 12a of the vacuum chuck unit 12 are chips separated in dicing a wafer and applied to the dicing tape 18. That is, the semiconductor chips 20 formed on the wafer are applied to the dicing tape 18 stretched across a ring frame 22 and diced with the dicing tape 18 remaining intact. Next, ultraviolet rays are projected on the dicing tape 18 to reduce the adhesion force of the dicing tape 18. Thereafter, the semiconductor chips 20 are placed and fixed by suction on the upper surface 12a of the vacuum chuck unit 12 with the dicing tape 18 facing upward.

It should be noted that the dicing tape 18 remains stretched across a ring frame 22 when the semiconductor chips 20 are placed on the upper surface 12a of the vacuum chuck unit 12, and thus the ring frame 22 is also fixed by suction on the upper surface 12a of the vacuum chuck unit 12.

After the semiconductor chips 20 and the ring frame 22 are fixed by suction on the upper surface 12a of the vacuum chuck unit 12, the removing board 16 is put on the dicing tape 18. The removing board 16 is a flat board member with one of its sides formed into an inclined plane. The removing board 16 is arranged so that the side formed into an inclined plane is parallel to the direction in which the semiconductor chips 20 are aligned.

By pulling a margin of the dicing tape 18 in the direction of the removing board 16 and simultaneously sliding the removing board 16 in the same direction while pressing the removing board 16 against the dicing tape, the dicing tape 18 is removed from the semiconductor chips 20.

In the present embodiment, the dicing tape 18 is removed from all of the semiconductor chips 20 in the above-mentioned removing process. After the dicing tape 18 is removed from all of the semiconductor chips 20, the semiconductor chips 20 are unfixed by ceasing the suction. Without fixation, the semiconductor chips 20 are simply placed on the upper surface 12a of the vacuum chuck unit 12. Thereafter, the semiconductor chips 20 are picked up and held by the pick up head 14 and conveyed to predetermined locations. The pick up head 14 holds the semiconductor chips 20 by vacuum suction force. Descriptions of the pick up head 14 will be omitted, because a conventional mechanism can be used as the pick up head 14.

Figure 3A:
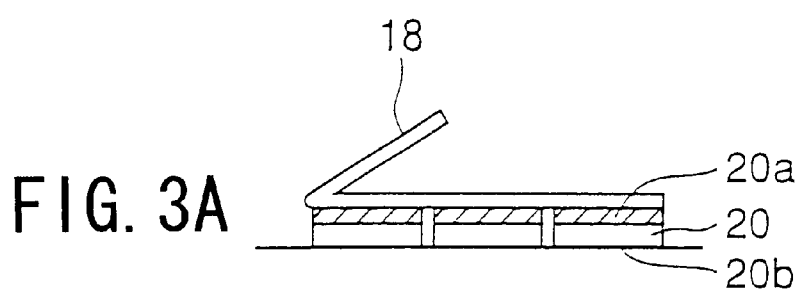
FIG. 3A is an illustration for explaining arrangements of semiconductor chips in a case where a dicing tape 18 is applied to a circuit-containing surface 20a of semiconductor chips 20.
Figure 3B:
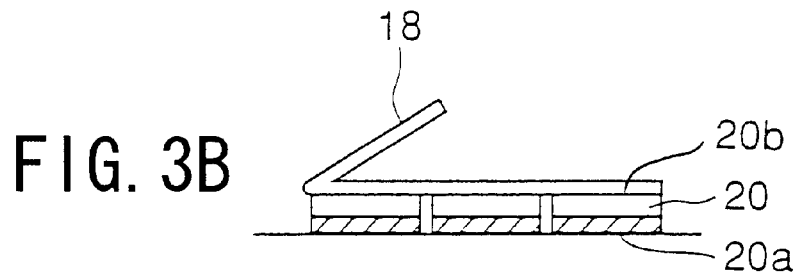
FIG. 3B is an illustration for explaining arrangements of semiconductor chips in a case where a dicing tape 18 is applied to a back surface 20b opposite to a circuit-containing surface 20a of semiconductor chips 20.

According to the removing method of the present embodiment, the same removing process is applicable to both of the following cases: a case in which the dicing tape 18 is applied to a circuit-containing containing surface 20a of the semiconductor chips 20 (as shown in FIG. 3A); and another case in which the dicing tape 18 is applied to a back surface 20b opposite to the circuit-containing surface 20a of the semiconductor chips 20 (as shown in FIG. 3B).

In the case shown in FIG. 3A, the back surface 20b of the semiconductor chips 20 is grinded (referred to as back grinding), and the conventional needle push-up method may damage the circuit-containing surface 20a. A conventional way to avoid this damage is to apply an adhesive tape to the back surface 20b of the semiconductor chips 20 to fix the semiconductor chips 20, and thereafter removing the dicing tape 18 by a removing method. However, in the present embodiment, an adhesive tape does not need to be applied to the back surface 20b of the semiconductor chips 20, because the vacuum chuck unit 12 can fix the semiconductor chips 20 by suction, and the process is simplified.

As mentioned above, according to the present embodiment, the semiconductor chips 20 are fixed on the vacuum chuck unit 12, removed from the dicing tape 18 by a removing method and immediately picked up and conveyed. Hence, the conventional process of pushing up the semiconductor chips 20 by a needle is unnecessary and the semiconductor chips 20 are not damaged in a removing process. Accordingly, the yield rate and reliability of semiconductor chips are increased. Additionally, the device and the process are simplified because the needle push-up process does not need to be performed.

Also, in the case where the dicing tape 18 is applied to the back surface 20b of the semiconductor chips 20, the same removing process is applicable. Hence, processes of applying an adhesive tape to the semiconductor chips 20 and thereafter removing the dicing tape 18 are unnecessary. Additionally, as the semiconductor chips 20 are removed from the dicing tape 18 and immediately picked up and conveyed, the conveying process can be performed immediately after completion of the removing process.

Figure 4:
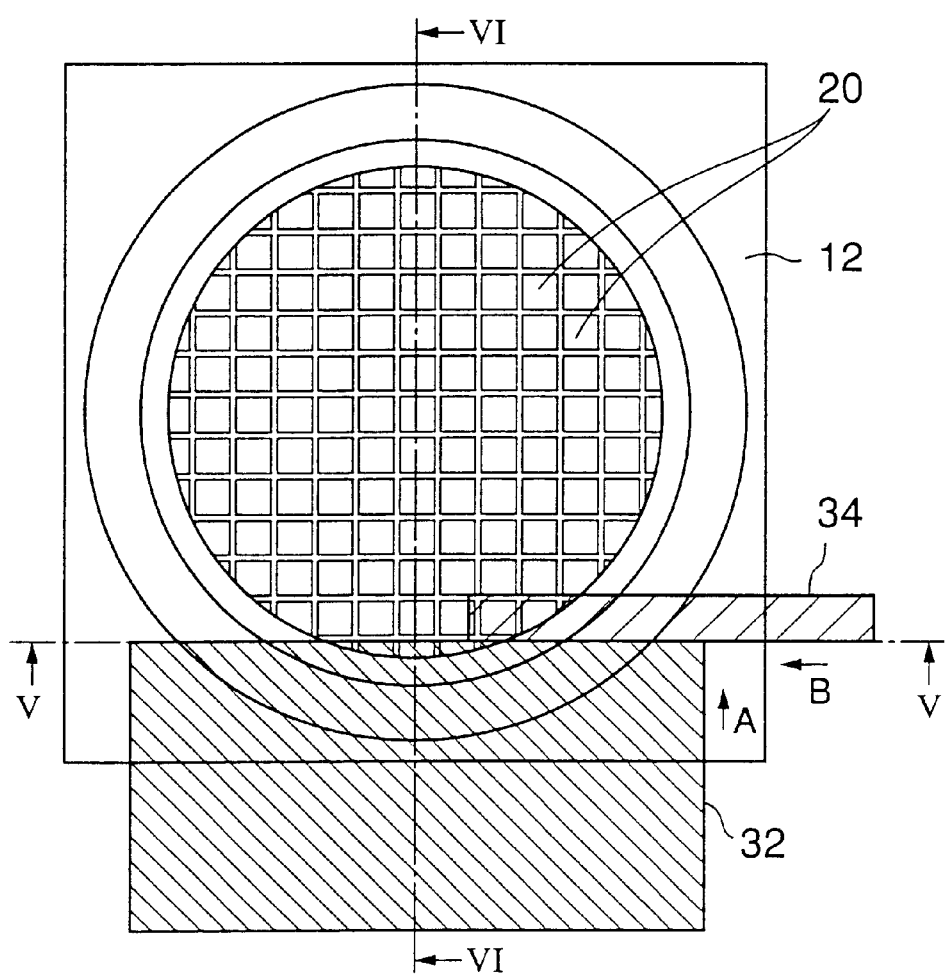
FIG. 4 is a plan view of a device for removing and conveying semiconductor chips according to a second embodiment of the present invention.
Figure 5:
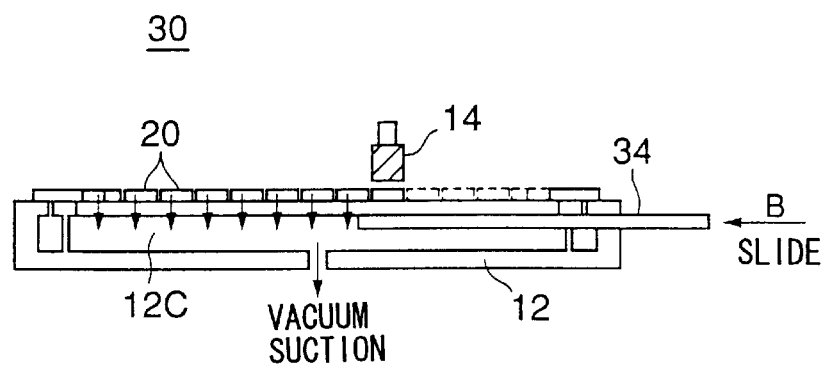
FIG. 5 is a cross-sectional view taken along line V—V in FIG. 4.
Figure 6:
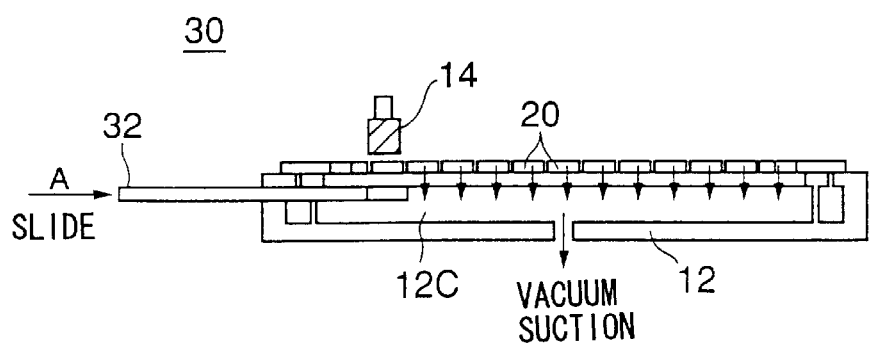
FIG. 6 is a cross-sectional view taken along line VI—VI in FIG. 4.

Next, a description will be given, with reference to FIG. 4 to FIG. 6, of a second embodiment according to the present invention. FIG. 4 is a plan view of a device for removing and conveying semiconductor chips according to the second embodiment of the present invention. FIG. 5 is a cross-sectional view taken along a line V—V in FIG. 4. FIG. 6 is a cross-sectional view taken along a line VI—VI in FIG. 4. In FIG. 4 to FIG. 6, the same reference numbers are used for designating parts equivalent to those in FIG. 1 and FIG. 2, and descriptions of those equivalent parts in FIG. 4 to FIG. 6 will be omitted.

A semiconductor chip removing and conveying device 30 (referred to as device 30 hereafter) according to the present embodiment has the same configuration as the above-mentioned device 10 according to the first embodiment, except that the vacuum chuck unit 12 is provided with a first shutter 32 and a second shutter 34. It should be noted that, according to the present embodiment, the upper surface 12 $a$ of the vacuum chuck unit 12 is made of a porous member so that the whole surface causes suction force.

In the device 30 according to the present embodiment, the dicing tape 18 is removed from the semiconductor chips 20, as in the above-mentioned device 10. Thereafter, each of the semiconductor chips 20 on the upper surface 12 $a$ of the vacuum chuck unit 12 is kept fixed to the vacuum chuck unit 12 by suction without the fixation force of the dicing tape 18.

At this point, in order to pick up the semiconductor chips 20 by the pick up head 14, the semiconductor chips 20 targeted to be picked up have to be unfixed by ceasing suction. For this purpose, the device 30 according to the present embodiment is provided with the first shutter 32 and the second shutter 34.

As shown in FIG. 4, the first shutter 32 is arranged so that one of its sides lines up to the edge row of the semiconductor chips 20. Then, the first shutter 32 is slid row by row in a direction shown by an arrow A each time a row of the semiconductor chips 20 is conveyed. The second shutter 34 is movable in a direction shown by an arrow B along the above-mentioned side of the first shutter 32. It should be noted that the first shutter 32 and the second shutter 34 are movable while keeping the suction component 12 $c$ in the vacuum chuck unit 12 airtight.

The first shutter 32 and the second shutter 34 are each slid while keeping contact with the backside of the upper surface 12 $a$ of the vacuum chuck unit 12. Accordingly, the semiconductor chips 20 placed at the portion of the upper surface 12 $a$ masked from underneath by the first shutter 32 and the second shutter 34 are unfixed by ceasing suction.

The device 30 according to the present embodiment unfixes the semiconductor chips 20 one by one and picks up and conveys the semiconductor chips 20 one by one using the pick up head 14, while sliding the first shutter 32 and the second shutter 34 accordingly. Specifically, the second shutter 34 slides from the right to the left one by one in the FIGS and the pick up head 14 picks up each semiconductor chip 20 in the row of the semiconductor chips 20. After completion of the picking up of the row, the second shutter 34 is returned to the right edge. Then, the first shutter 32 slides to mask the portion corresponding to the removed row of the semiconductor chips 20. Subsequently, the second shutter 34 slides in a direction shown by the arrow B in the figures and the pick up head 14 picks up and conveys the next row of the semiconductor chips 20.

By repeating the above-mentioned operations, all of the semiconductor chips 20 on the vacuum chuck unit 12 are picked up and conveyed by the pick up head 14. In this conveying process, each of the semiconductor chips 20 on the vacuum chuck unit 12 is fixed by suction until being picked up by the pick up head 14, so that the semiconductor chips 20 remain in the same position until being picked up.

Additionally, by making the first shutter 32 movable in a variable distance for each row and the first shutter 34 exchangeable, the vacuum chuck unit 12 can be commonly used for semiconductor chips of different sizes.

Figure 7:
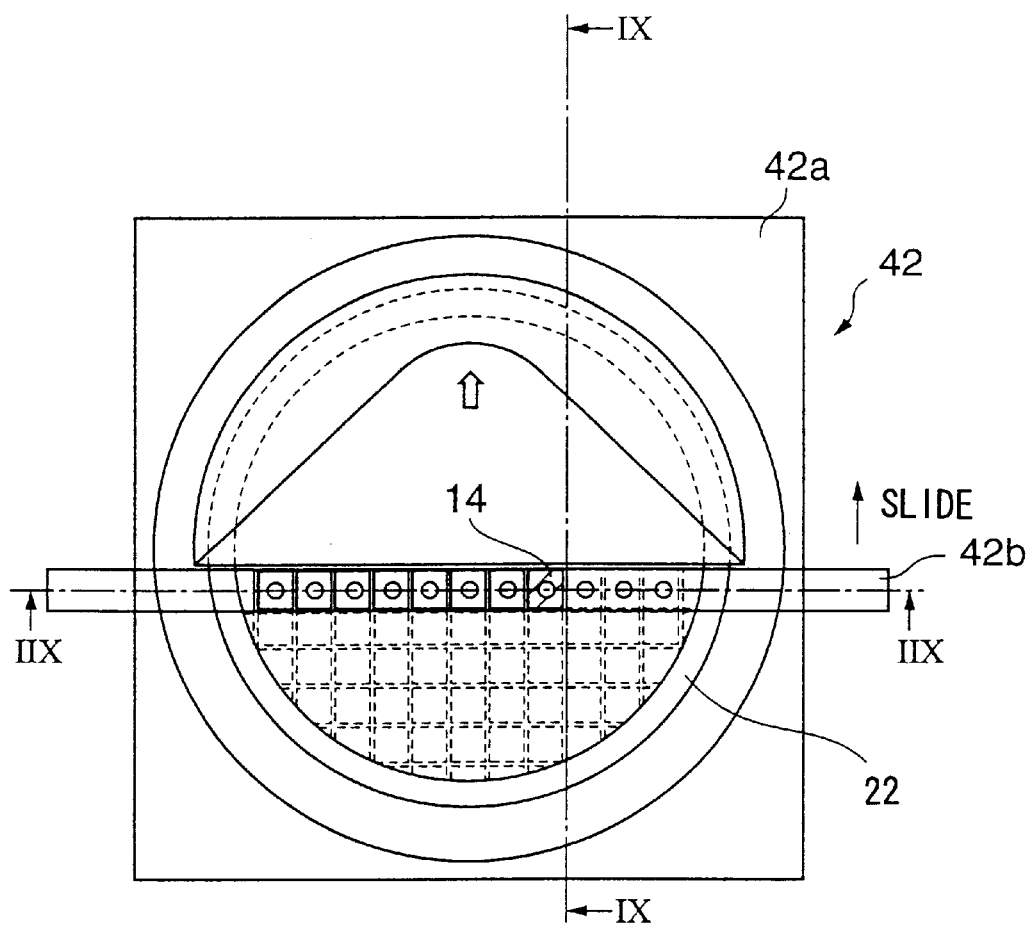
FIG. 7 is a plan view of a device for removing and conveying semiconductor chips according to a third embodiment of the present invention.
Figure 8:
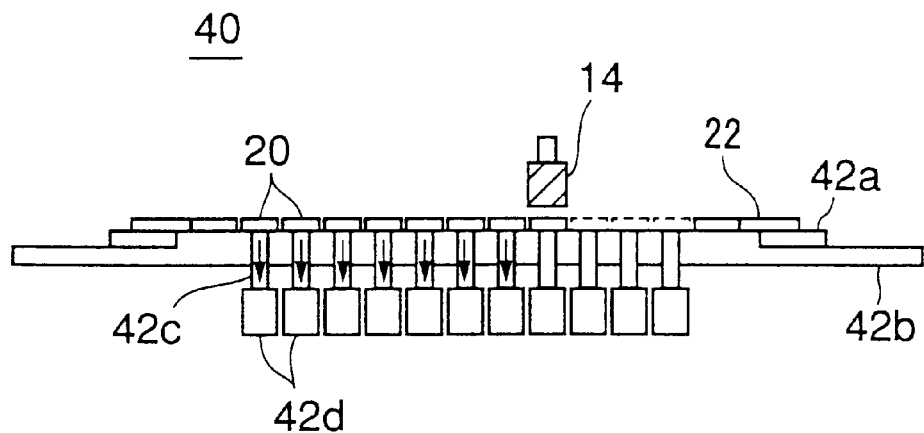
FIG. 8 is a cross-sectional view taken along line IIX—IIX in FIG. 7.
Figure 9:
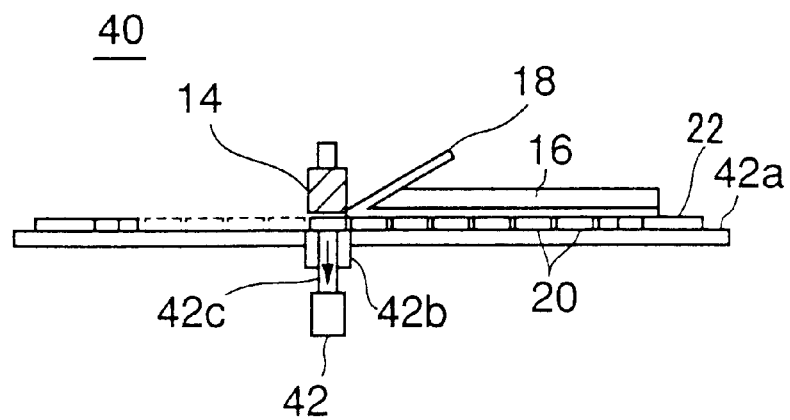
FIG. 9 is a cross-sectional view taken along line IX—IX in FIG. 7.

Next, a description will be given, with reference to FIG. 7 to FIG. 9, of a third embodiment according to the present invention. FIG. 7 is a plan view of a device for removing and conveying semiconductor chips according to the third embodiment of the present invention. FIG. 8 is a cross-sectional view taken along a line IIX—IIX in FIG. 7. FIG. 9 is a cross-sectional view taken along a line IX—IX in FIG. 7. In FIG. 7 to FIG. 9, the same reference characters are used for designating parts equivalent to those in FIG. 1 and FIG. 2, and descriptions of those equivalent parts in FIG. 7 to FIG. 9 will be omitted.

A semiconductor chip removing and conveying device 40 (referred to as device 40 hereafter) according to the present embodiment uses a vacuum chuck unit 42 in place of the vacuum chuck unit 12. The vacuum chuck unit 42 is arranged to have a configuration that fixes only one row at a time of the semiconductor chips 20 by suction.

The vacuum chuck unit 42 comprises a chuck frame 42$a$ which supports the semiconductor chips 20 applied to the dicing tape 18 and a mobile chuck 42$b$ which is movable in the chuck frame 42$a$. The ring frame 22 with the dicing tape 18 is mounted on the chuck frame 42$a$ so that the semiconductor chips 20 applied to the dicing tape 18 are held on the chuck frame 42$a$.

The mobile chuck 42$b$ is shaped to match a row of the semiconductor chips 20 and has suction paths 42$c$ located correspondingly to each semiconductor chip 20 in the row. Each of the suction paths 42$c$ is provided with an electromagnetic valve 42$d$ that opens and closes each suction path 42$c$. When the electromagnetic valve 42$d$ opens the suction path 42$c$, the semiconductor chip 20 placed at the end of the suction path 42$c$ is fixed by suction on the mobile chuck 42$b$. On the other hand, when the electromagnetic valve 42$d$ closes the suction path 42$c$, the semiconductor chip 20 placed at the end of the suction path 42$c$ is unfixed by ceasing the suction.

In the device 40 according to the present embodiment, after the semiconductor chips 20 applied to the dicing tape 18 are placed on the chuck frame 42$a$, the dicing tape 18 is partially removed from one row of the semiconductor chips 20. While doing this, the row of the semiconductor chips 20 to be removed from the dicing tape 18 is fixed on the mobile chuck 42$b$ by suction, by shifting the mobile chuck 42$b$ to right under the row of the semiconductor chips 20 and opening each of the electromagnetic valves 42$d$.

Subsequently, the pick up head 14 is moved to right over the row of the semiconductor chips 20 to be picked up, and then a semiconductor chip 20 in the row is held by vacuum suction force of the pick up head 14, while the electromagnetic valve 42$d$ closes the suction path 42$c$ which has been fixing by suction the semiconductor chip 20 to be picked up. This allows each of the semiconductor chips 20 to be easily held by the pick up head 14 and conveyed to predetermined locations.

By repeating the above-mentioned operations, all the semiconductor chips 20 in the row are picked up and conveyed. After completion of the picking up of the row, the mobile chuck 42$b$ is slid to right under the next row of the semiconductor chips 20 and each of the electromagnetic valves 42$d$ is opened to fix by suction each semiconductor chip 20 in the row. Then, the dicing tape 18 is removed from the row of the semiconductor chips 20, and the above-mentioned operations are repeated.

As mentioned above, according to the present embodiment, the conveying process can be immediately performed with the dicing tape 18 being removed solely from one row of the semiconductor chips 20. This reduces the total time of the removing process and the conveying process. During the conveyance of the one row of the semiconductor chips 20, the rest of the semiconductor chips 20 still remain applied to the dicing tape 18. Thus, the rest of the semiconductor chips 20 remain in the same position and protected by the dicing tape 18.

Figure 10:
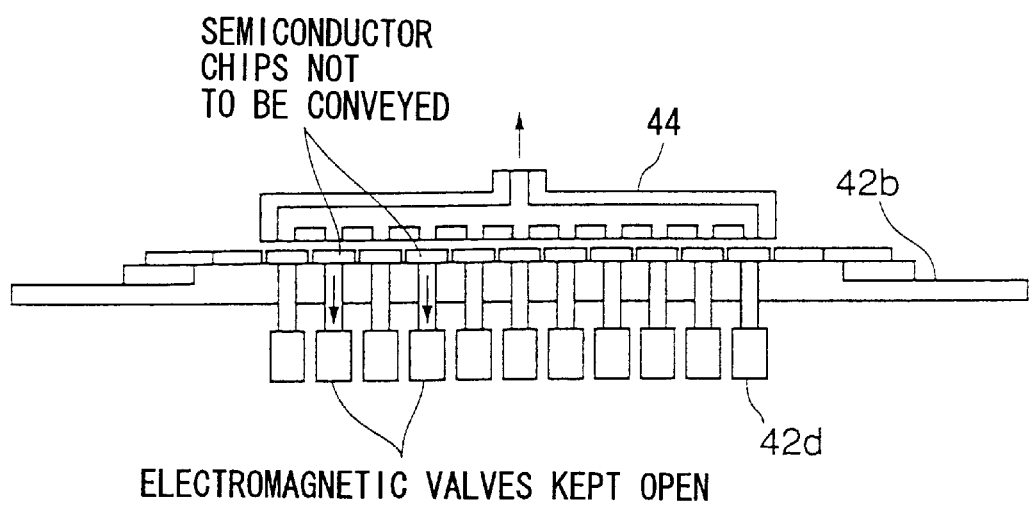
FIG. 10 is a cross-sectional view of a variation of the device for removing and conveying semiconductor chips according to the third embodiment of the present invention.

In the present embodiment, as shown in FIG. 10, the pick up head 14 may be replaced by a pick up head 44 having a configuration that can hold all of the semiconductor chips 20 in one row at a time by vacuum suction force so that all of the semiconductor chips 20 in one row are picked up and conveyed at a time. In doing this, by leaving open electromagnetic valves 42d corresponding to semiconductor chips 20 tested beforehand as inferior, the other semiconductor chips 20 can be picked up and conveyed, leaving the inferior semiconductor chips 20.

Figure 11:
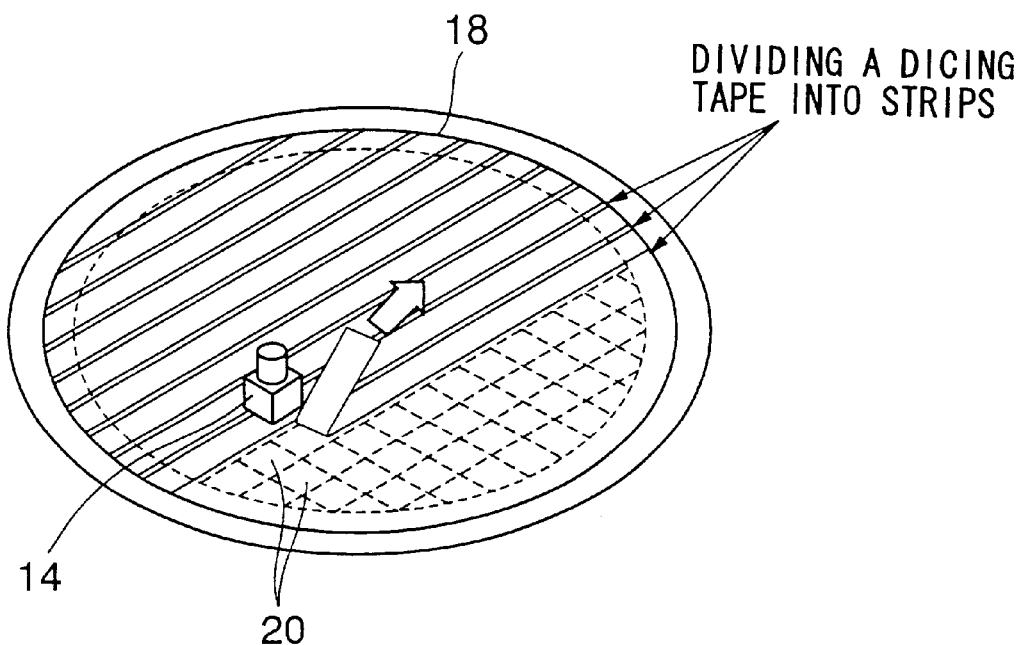
FIG. 11 is a perspective view for explaining processes of a device for removing and conveying semiconductor chips according to a fourth embodiment of the present invention.
Figure 12:
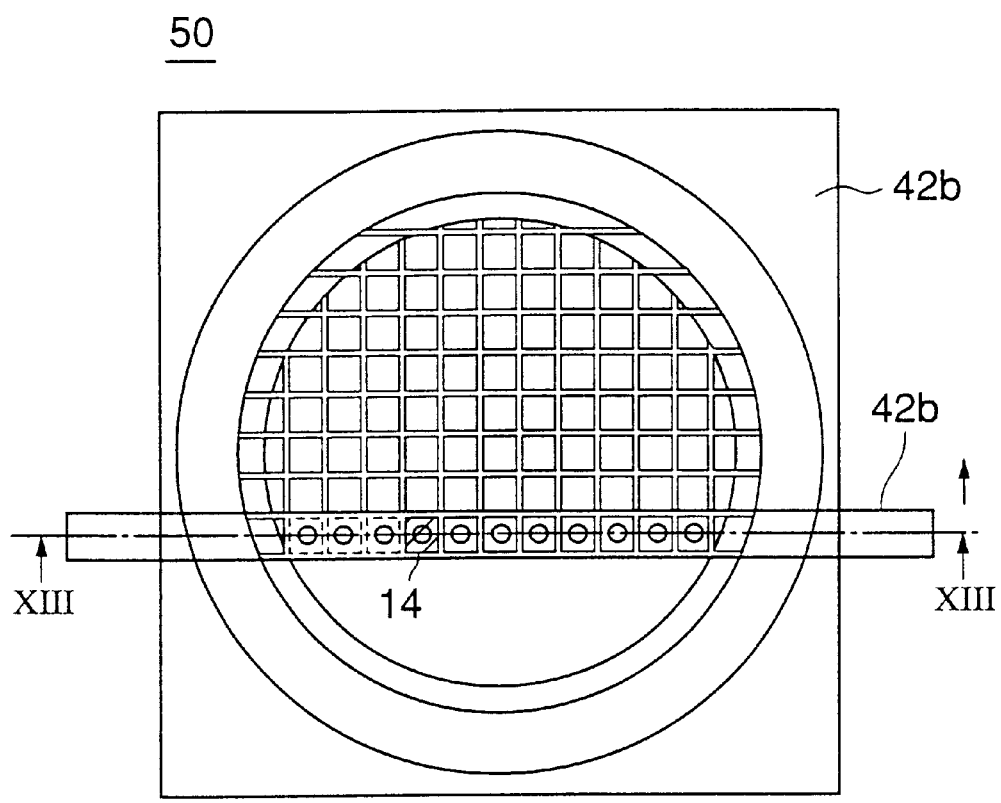
FIG. 12 is a plan view of the device for removing and conveying semiconductor chips according to the fourth embodiment of the present invention.
Figure 13:
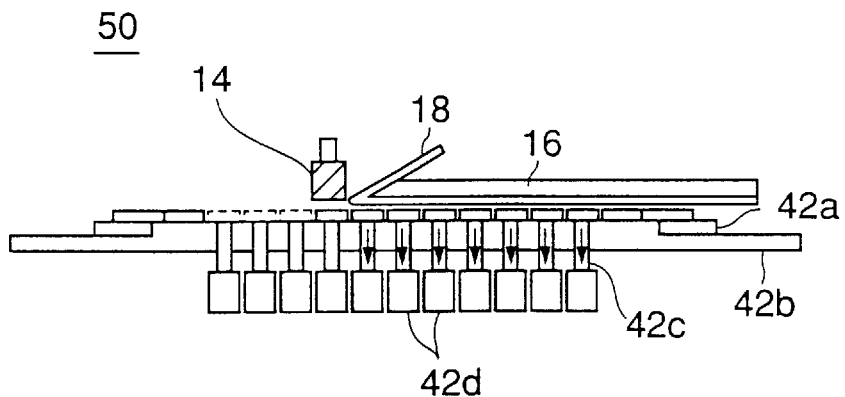
FIG. 13 is a cross-sectional view taken along line XIII—XIII in FIG. 12.

Next, a description will be given, with reference to FIG. 11 to FIG. 13, of a fourth embodiment according to the present invention. FIG. 11 is a perspective view for explaining processes of a device for removing and conveying semiconductor chips according to the fourth embodiment of the present invention. FIG. 12 is a plan view of the device for removing and conveying semiconductor chips according to the fourth embodiment of the present invention. FIG. 13 is a cross-sectional view taken along a line XIII—XIII in FIG. 12. In FIG. 11 to FIG. 13, the same reference characters are used for designating parts equivalent to those in FIG. 7 to FIG. 9, and descriptions of those equivalent parts in FIG. 11 to FIG. 13 will be omitted.

A semiconductor chip removing and conveying device 50 (referred to as device 50 hereafter) according to the present embodiment has a configuration in which the dicing tape 18 is divided along rows of the semiconductor chips 20 before being removed. That is, as shown in FIG. 11, in dicing the semiconductor chips 20 formed on a wafer, only the wafer is diced while keeping the dicing tape 18 intact in one direction of the dicing. Yet, in a dicing perpendicular to the direction, the dicing tape 18 is diced together with the wafer. Hence, the dicing tape 18 is divided into strips. At this point, the dicing tape 18 remains applied to the ring frame 22.

The strips of the dicing tape 18 are individually removed strip by strip. When the strip of the dicing tape 18 is partially removed from one semiconductor chip 20, the semiconductor chip 20 is unfixed by ceasing suction and immediately picked up and conveyed by the pick up head 14.

After completion of the picking up for one row of the semiconductor chips 20, the same operations are performed for each semiconductor chip 20 in the next row. Hence, according to the present embodiment, the conveying process can be immediately performed with the dicing tape 18 being removed solely from one of the semiconductor chips 20. This reduces the total time of the removing process and the conveying process. During the conveyance of the semiconductor chip 20, the rest of the semiconductor chips 20 still remain applied to the dicing tape 18. Thus, the rest of the semiconductor chips 20 remain in the same position and protected by the dicing tape 18.

Additionally, it is easy to partially remove the dicing tape 18 from one semiconductor chip 20, and this prevents the semiconductor chips 20 from being damaged in the removing process. It should be noted that the removing board 16 does not need to have a width wider than the semiconductor chip 20 in the present invention.

Figure 14:
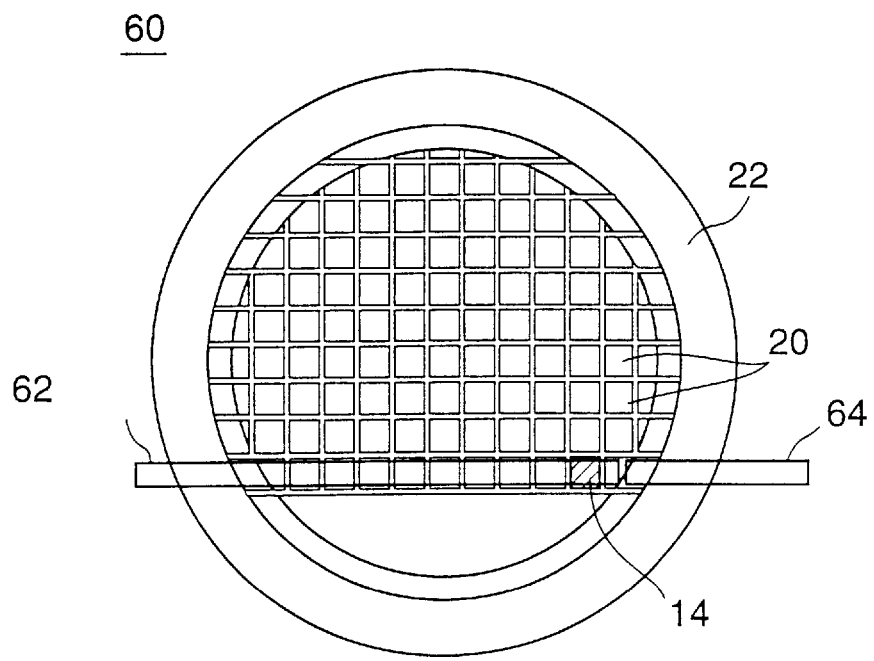
FIG. 14 is a plan view of a device for removing and conveying semiconductor chips according to a fifth embodiment of the present invention.
Figure 15:
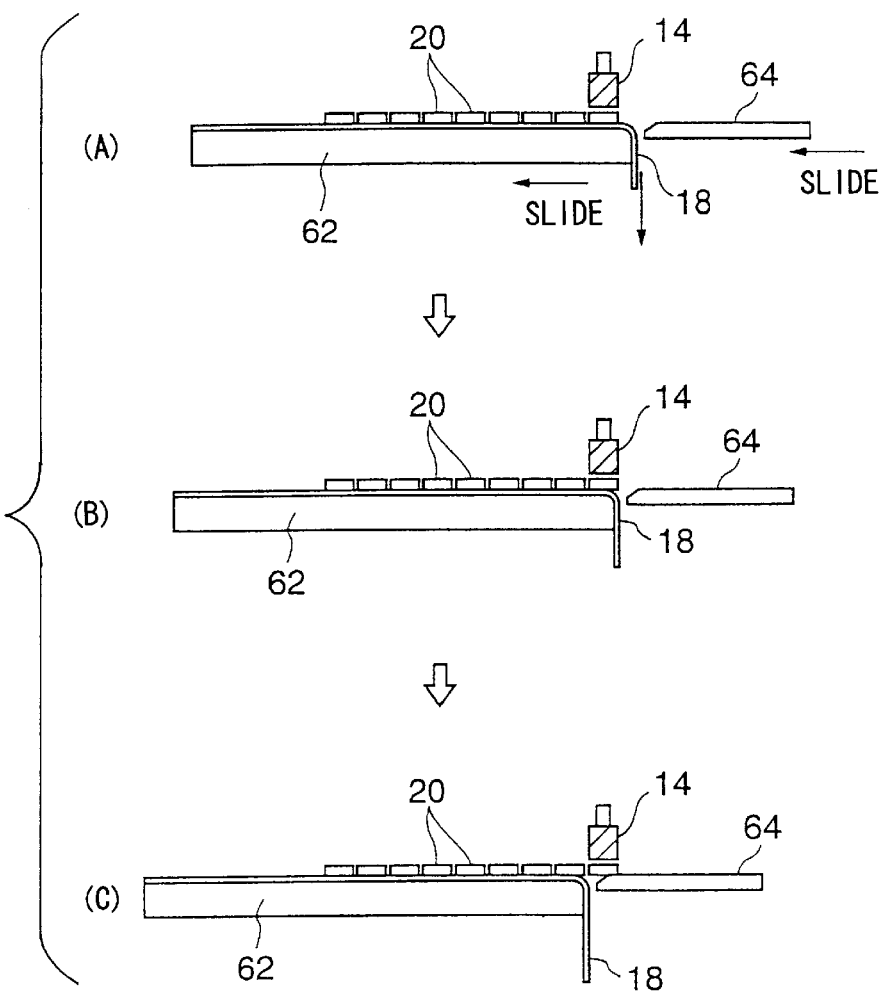
FIG. 15 is a side view for explaining operations of the device for removing and conveying semiconductor chips according to the fifth embodiment of the present invention.

Next, a description will be given, with reference to FIG. 14 and FIG. 15, of a fifth embodiment according to the present invention. FIG. 14 is a plan view of a device for removing and conveying semiconductor chips according to the fifth embodiment of the present invention. FIG. 15 is a side view for explaining operations of the device for removing and conveying semiconductor chips according to the fifth embodiment of the present invention.

A semiconductor chip removing and conveying device 60 (referred to as device 60 hereafter) according to the present embodiment does not fix by suction the semiconductor chips 20 when removing the dicing tape 18. Instead, the semiconductor chips 20 are transferred onto a chip receptacle as soon as they are removed from the dicing tape 18.

In the present embodiment, the dicing tape 18 is divided into strips as in the above-mentioned fourth embodiment, and the semiconductor chips 20 are arranged so that the side to which the dicing tape is applied faces downward.

Then, as shown in FIG. 15-(A), a removing stage 62 is placed under the dicing tape 18 in strips. That means the semiconductor chips 20 are placed on the removing stage 62 with the dicing tape 18 in between. Next, a margin of a strip of the dicing tape 18 is bent downward around an edge of the removing stage 62. A chip receptacle 64, being movable, is arranged close to the bent part of the strip of the dicing tape 18. The margin of the dicing tape 18 hangs down through the slit between the removing stage 62 and the chip receptacle 64.

Thereafter, the removing stage 62 and the chip receptacle 64 are slid to the left in the FIG. 15 while the margin of the dicing tape 18 hanging down is being pulled downward, so that, as shown in FIG. 15-(B), the bent part of the strip of the dicing tape 18 moves to where the semiconductor chip 20 is applied. The semiconductor chip 20 is removed from the dicing tape 18, being kept horizontal because the dicing tape 18 is bent sharply downward. The removing stage 62 and the chip receptacle 64 continue to be slid to the left, so that the semiconductor chip 20 is transferred to the chip receptacle 64, as shown in FIG. 15-(C). Thereafter, the semiconductor chip 20 transferred to the chip receptacle 64 is held by vacuum suction force of the pick up head 14 and conveyed to predetermined locations.

As mentioned above, according to the present embodiment, the dicing tape 18 can be removed without fixing by suction the diced semiconductor chips 20. Also, the semiconductor chips 20 removed from the dicing tape 18 are automatically transferred to the chip receptacle 64 and are easily picked up by the pick up head 14.

Figure 16:
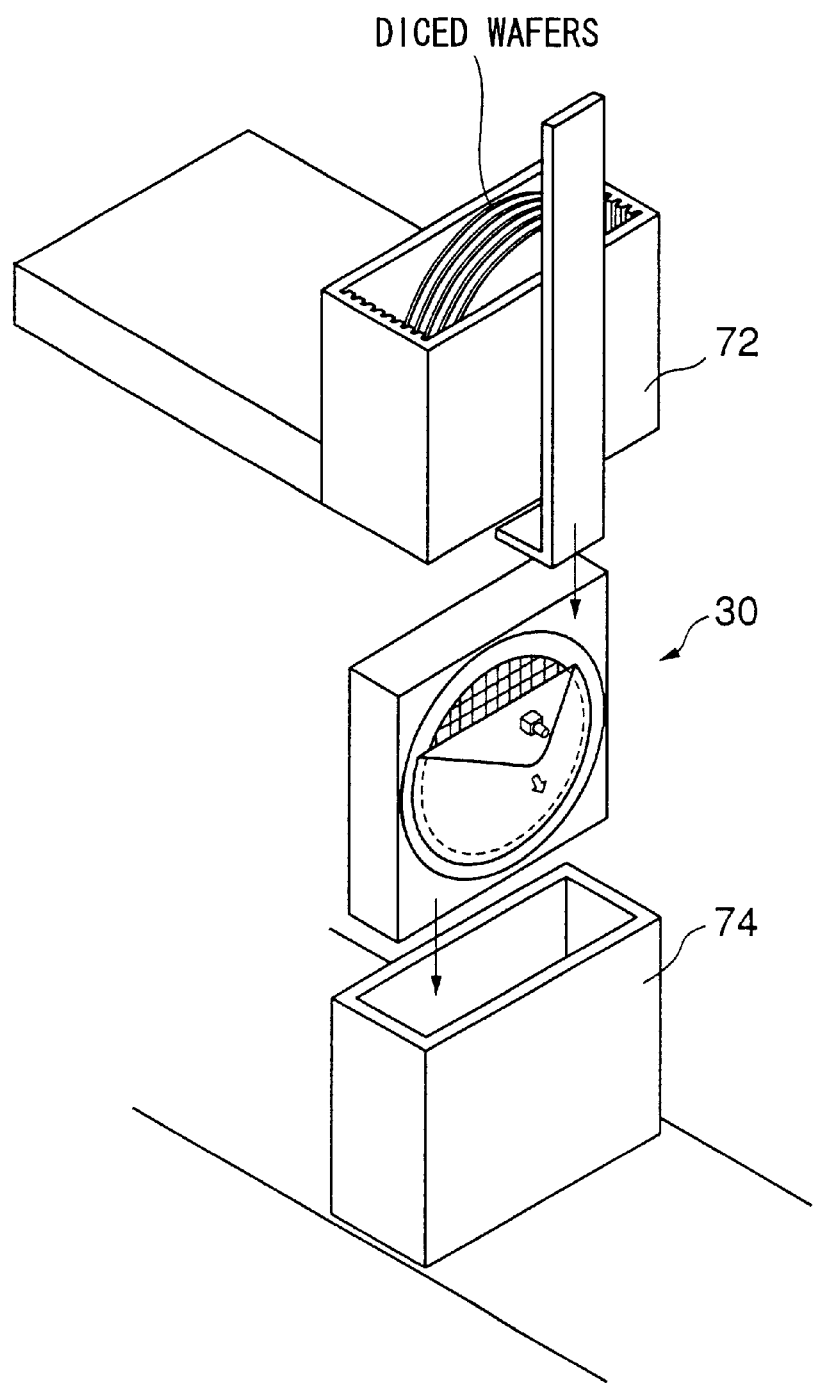
FIG. 16 is a perspective view of a peripheral configuration of a device for removing and conveying semiconductor chips.

Next, a description will be given, with reference to FIG. 16, of a peripheral configuration of the devices for removing and conveying semiconductor chips according to the second to fourth embodiments of the present invention. FIG. 14 is a plan view of a device for removing and conveying semiconductor chips according to the fifth embodiment of the present invention.

In the devices 30, 40 and 50 according to the second to fourth embodiments, each of the semiconductor chips 20 is fixed by suction of the vacuum chuck unit 12 or 42 until each of the semiconductor chips 20 is removed from the dicing tape 18 and held by vacuum suction force of the pick up head 14. Hence, the semiconductor chips 20 do not fall when a wafer on which the semiconductor chips 20 are formed is arranged upright. Thus, as shown in FIG. 16 depicting an example using the device 30, the vacuum chuck unit 12 can be arranged so that its upper surface 12a is vertical.

Accordingly, a wafer magazine 72 containing diced wafers can be arranged above the device 30, and thus the wafers can be conveyed to the device 30 by using gravity.

Additionally, a storing container 74 can be arranged so that the used dicing tape 18, waste of the wafers and the ring frame 22 are contained therein by gravity after the semiconductor chips 20 are picked up and removed. This simplifies the peripheral configuration of the device 30.

The present invention is not limited to the specifically disclosed embodiments, and variations and modifications may be made without departing from the scope of the present invention.

The present application is based on Japanese priority application No. 2000-163651 filed on May 31, 2000, the entire contents of which are hereby incorporated by reference.

What is claimed is:

1. A method of removing and conveying semiconductor chips, said method comprising the steps of:

dicing a wafer while keeping intact a dicing tape applied to said wafer, said wafer having a plurality of semiconductor chips formed thereon;

fixing by suction a surface of each of said semiconductor chips, said surface being opposite to another surface to which said dicing tape is applied;

removing said dicing tape from said semiconductor chips; and picking up and conveying said semiconductor chips while unfixing said semiconductor chips by ceasing suction, wherein the step of removing and the step of picking up and conveying are repeated for each row of said semiconductor chips, in a manner of removing said dicing tape from one row of said semiconductor chips, picking up and conveying said one row of said semiconductor chips and then removing said dicing tape from the next row of said semiconductor chips.

2. The method as claimed in claim 1, strips along rows of said semiconductor chips in dicing said wafer, and wherein the step of removing and the step of picking up and conveying are performed individually for each of said semiconductor chips chip in one row of said semiconductor chips, immediately picking up and conveying said one semiconductor chip and then removing said dicing tape from another semiconductor chip.

3. A method of removing and conveying semiconductor chips, said method comprising the steps of:

dicing a wafer while keeping intact a dicing tape applied to said wafer, said wafer having a plurality of semiconductor chips formed thereon;

placing said semiconductor chips on a removing stage with the side to which said dicing tape is applied facing downward toward said removing stage;

removing said dicing tape from said semiconductor chips by bending a margin of said dicing tape downward around an edge of said removing stage and moving said removing stage while pulling said margin of said dicing tape downward;

transferring said semiconductor chips removed from said dicing tape to a chip receptacle by arranging said chip receptacle close to said edge of said removing stage and moving said chip receptacle together with said removing stage; and picking up and conveying said semiconductor chips transferred to said chip receptacle.

* * * * *

UNITED STATES PATENT AND TRADEMARK OFFICE
CERTIFICATE OF CORRECTION

PATENT NO. : 6,461,942 B2
DATED : October 8, 2002
INVENTOR(S) : Watanabe, Mitsuhisa et al.

It is certified that error appears in the above-identified patent and that said Letters Patent is hereby corrected as shown below:

<u>Title page,</u>
Item [73], Assignee, amend information, so as to read as follows:
-- Fujitsu Limited, Kawasaki Japan and Fujitsu Automation Limited, Kawasaki Japan --

Signed and Sealed this

Seventeenth Day of February, 2004

JON W. DUDAS
*Acting Director of the United States Patent and Trademark Office*